(12) United States Patent
Wu et al.

(10) Patent No.: US 7,670,947 B2
(45) Date of Patent: Mar. 2, 2010

(54) METAL INTERCONNECT STRUCTURE AND PROCESS FOR FORMING SAME

(75) Inventors: Tsang-Jiuh Wu, Hsinchu (TW); Syun-Ming Jang, Hsinchu (TW); Ming-Chung Liang, Hsinchu (TW); Hsin-Yi Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 463 days.

(21) Appl. No.: 11/652,077

(22) Filed: Jan. 11, 2007

(65) Prior Publication Data

US 2008/0171442 A1 Jul. 17, 2008

(51) Int. Cl.
*H01L 21/4763* (2006.01)
*H01L 21/311* (2006.01)

(52) U.S. Cl. .......................... 438/637; 438/9; 438/638; 438/639; 438/697; 438/709; 257/E21.218; 257/E21.311; 257/E21.579

(58) Field of Classification Search ................. 438/637, 438/638, 702, 639, 697, 709, 9; 257/702, 257/E21.218, E21.311, E21.579
See application file for complete search history.

(56) References Cited

U.S. PATENT DOCUMENTS

| | | | | |
|---|---|---|---|---|
| 5,773,361 | A * | 6/1998 | Cronin et al. | 438/637 |
| 6,025,277 | A * | 2/2000 | Chen et al. | 438/738 |
| 6,551,938 | B1 | 4/2003 | Wu et al. | |
| 6,720,256 | B1 | 4/2004 | Wu et al. | |
| 6,797,630 | B1 | 9/2004 | Wu et al. | |
| 2006/0216932 | A1* | 9/2006 | Kumar et al. | 438/641 |
| 2008/0201682 | A1* | 8/2008 | Shigyo et al. | 716/13 |

OTHER PUBLICATIONS

Quirk et al., Semiconductor Manufacturing Technology, Chapter 9, pp. 205-223, 2001.
Wolf et al., Silicon Processing for the VLSI Era, vol. 1, $2^{nd}$ Edition, pp. 797-806, 2000.
Sze, Semiconductor Devices—Physics and Technology, $2^{nd}$ Edition, pp. 439-443, 2002.
Wolf, Silicon Processing for the VLSI Era, vol. 4, Chapter 15, pp. 671-710, 2002.
Professor N Cheung, "Metallization," U.C. Berkeley, Lecture 17, www-inst.eecs.berkeley.edu/~ee143/fa05/lectures/Lec_17.pdf, pp. 1-34, 2005.
Professor N Cheung, "Multilevel Interconnect Structures," U.C. Berkeley, Lecture 18, www-inst.eecs.berkeley.edu/~ee143/fa05/lectures/Lec_18.pdf, 2005.

* cited by examiner

*Primary Examiner*—Long K Tran
(74) *Attorney, Agent, or Firm*—Finnegan, Henderson, Farabow, Garrett & Dunner, LLP

(57) ABSTRACT

A process for forming an interconnect structure in a low-k dielectric layer includes etching to form trenches in the dielectric layer, removal of photoresist, and further etching to remove damaged portions of the dielectric layer in sidewalls of the trenches. An interconnect structure includes a low-k dielectric layer formed on a substrate, and a conductor embedded in the dielectric layer, the conductor having an edge portion with an inwardly rounded shape.

15 Claims, 8 Drawing Sheets

METAL INTERCONNECT STRUCTURE AND PROCESS FOR FORMING SAME

BACKGROUND OF THE INVENTION

1. Field of the Invention

The invention is directed to an interconnect structure formed in a low-k dielectric layer and a process for forming same.

2. Description of the Related Art

Damascene processes are well known for forming conductive interconnect structures in semiconductor devices. Both single- and dual-damascene processes include forming vias and trenches in a layer of dielectric material, e.g., an inter-metal dielectric layer (IMD), and filling the vias and trenches with a conductive material such as aluminum or copper. More recently, as device dimensions have continued to decrease and via and trench widths have become correspondingly smaller, there has been an ongoing concern about increased signal propagation delay caused by the combined effect of the resistance and capacitance (RC delay) associated with the interconnect structures. In an attempt to reduce the RC delay, copper is often used as an interconnect material instead of aluminum because copper has a lower resistivity, and techniques have been developed to successfully deposit copper to form interconnect structures. In order to further improve RC delay, dielectric materials having a lower dielectric constant than conventional dielectric materials, sometimes referred to as low-k dielectric materials, have also been employed. In general, low-k dielectric materials are materials having a dielectric constant less than about 3.9, which is an approximate lower end of a range of dielectric constants for conventional dielectric materials such as silicon dioxide.

In both the single- and dual-damascene processes, several layers are formed on a substrate. Namely, a low-k dielectric layer is formed on an etch stop layer (ESL), and a cap layer is formed on the low-k dielectric layer. A photoresist layer is then deposited on the cap layer and patterned to define locations where vias and/or trenches are to be etched through the cap layer and the low-k dielectric layer. The photoresist layer is next removed after completion of such etching.

Sidewalls of the trench or via formed in the low-k dielectric layer, however, may be damaged during the etching and/or photoresist removal operations. Such damage to the low-k layer causes the dielectric constant of the low-k layer to increase to a level approaching that of a conventional dielectrical material such as silicon dioxide. As a result, RC delay is increased. Possible solutions proposed for addressing this problem have included performing additional processing steps to repair the damaged portions of the low-k dielectric layer in order to restore the desired low dielectric constant. Such solutions have only achieved limited success.

SUMMARY OF THE INVENTION

In accordance with the present invention, there is provided a method for making a semiconductor integrated circuit, comprising: forming a low-k dielectric layer over the semiconductor substrate; forming a dielectric cap layer over a low-k dielectric layer; performing a first etching by plasma etching the dielectric cap layer and the low-k dielectric layer to form a first opening in the dielectric cap layer and a second opening in the low-k dielectric layer, the first and second openings each having a width substantially equal to a first dimension; and performing a second etching, by one of a plasma and a non-plasma etching technique, of sidewalls of the second opening so that a width of the second opening is a second dimension greater than the first dimension.

Also in accordance with the present invention, there is provided an interconnect structure, comprising: a low-k dielectric layer over a semiconductor substrate; and a conductor embedded in the low-k dielectric layer, the conductor having at least one edge portion blunted or rounded in shape.

Further in accordance with the present invention, there is provided an interconnect structure, comprising: a low-k dielectric layer over a semiconductor substrate; a dielectric cap layer over the low-k dielectric layer; and a conductor having a first portion embedded in the low-k dielectric layer and a second portion in the dielectric cap layer, the conductor having an edge portion blunted or rounded in shape proximate an interface between the first portion and the second portion.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and, together with the description, serve to explain the principles of the invention.

DETAILED DESCRIPTION OF THE EMBODIMENTS

Embodiments consistent with the invention are directed to methods, and structures that result therefrom, for forming a conductive metal interconnect structure of a semiconductor integrated circuit (IC). Such metal interconnect structures may be in an inter-level dielectric (ILD) layer formed over devices, e.g., transistors, or in an inter-metal dielectric (IMD) layer formed between or on top of other metal interconnect structures. Such methods can be implemented in either single- or dual-damascene processes, or other processes, for forming metal interconnect structures. Further, such methods are particularly beneficial for forming interconnect structures in ILD or IMD layers of dielectric material having a low dielectric constant, referred to herein as low-k dielectric material. As used herein, low-k dielectric material is intended to include dielectric materials having a dielectric constant of less than that of conventional dielectric materials such as silicon dioxide, which has a dielectric constant of about 3.9. Further, low-k dielectric material as used herein is intended to include dielectric materials having a substantially lower dielectric constant, e.g., less than 3.0 or less than 2.5, sometimes referred to as extra low-k dielectric materials.

As previously explained, processes for forming interconnect structures in low-k dielectric materials can result in damage to the dielectric material which causes an increase in the dielectric constant of the material. Embodiments consistent with the invention include methods for forming interconnect structures in low-k dielectric material in a manner that preserves the low dielectric constant of the material.

Figure 1A:
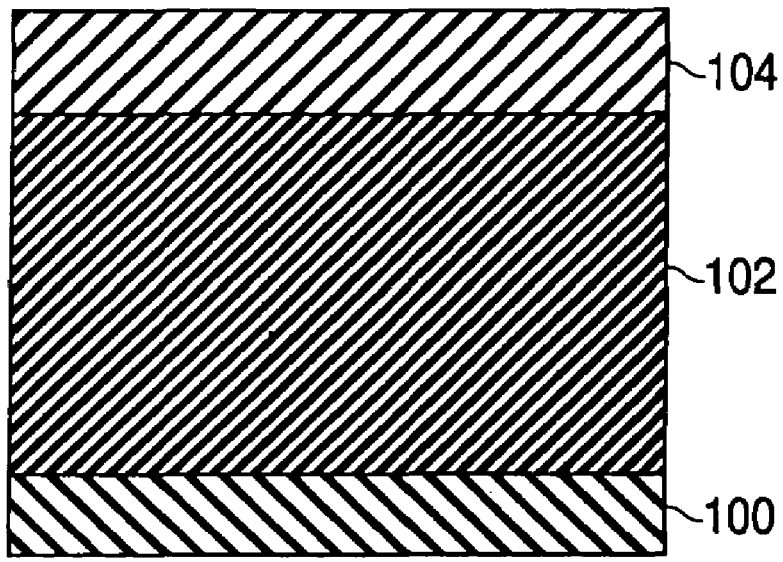
FIG. 1A-1F illustrate process steps consistent with an embodiment of the invention for forming an interconnect structure.

FIGS. 1A-1F illustrate a series of process steps consistent with an embodiment of the invention, for forming an interconnect structure in a low-k dielectric material as part of a process for fabricating a semiconductor integrated circuit (IC). With reference to FIG. 1A, consistent with damascene processes, an etch stop layer (ESL) 100 is formed over a lower layer of the semiconductor IC, not shown, being fabricated, that may contain devices or that may be another metal interconnect layer. ESL 100 should have a low selectivity to the etching processes intended to be used in the subsequent process steps described below. Typical materials for ESL 100 include silicon nitride and silicon carbide. For example, ESL 100, provided as silicon nitride, may be formed by chemical vapor deposition (CVD) and have a thickness in the range of 50 Å to 500 Å.

A low-k dielectric layer 102 is formed over ESL 100. The particular material selected for layer 102 will depend on the particular application. Two examples of many of the low-k dielectric materials currently available include fluorinated silicate glass which has a dielectric constant of about 3.5, and SiLK™, manufactured by Dow Chemical Company, which has a dielectric constant of about 2.7. Other examples of low-k dielectric materials that can be used to practice embodiments consistent with the present invention include porous films, organic low-k dielectric materials, inorganic low-k dielectric materials, and carbon containing films. The thickness of layer 102 may be in the range of 2000 Å to 7000 Å. The approximate thickness of layer 102 may be determined by the minimum feature size, i.e., critical dimension (CD), of the semiconductor IC being fabricated, as well as the particular dielectric material and its characteristics. For example, for a CD of 90 nm, layer 102 may have a thickness of less than about 7000 Å. For CDs of 80 nm, 65 nm, 45 nm, and 32 nm, layer 102 may have a thickness of less than about 6000 Å, 4000 Å, 3500 Å, and 2500 Å, respectively.

The process by which layer 102 is formed depends on the particular low-k dielectric material. As a result, layer 102 may be formed by, for example, chemical vapor deposition (CVD) or a spin-on process.

A cap layer 104 is formed over low-k dielectric layer 102. Cap layer 104 is also formed of a dielectric material, and may be provided as silicon oxide. Alternatively, cap layer 104 can be formed of silicon nitride, silicon oxynitride, or another oxynitride. Further, cap layer 104 can be a carbon-containing film such as silicon carbide. Still further, cap layer 104 can be a composite layer including a hard mask layer having a slower etch rate than low-k dielectric layer 102 and an organic or inorganic anti-reflective coating (ARC) layer. Examples of suitable materials for the hard mask layer include SiON, TEOS, and SiC.

For a CD of 90 nm or less, cap layer 104 preferably has a thickness of less than about 600 Å. Based on the examples listed above of materials that can be deposited to form cap layer 104, the dielectric constant of cap layer 104 is preferably greater than at least 2.8 if layer 104 is provided as a protection layer to prevent low-k dielectric layer 102 from damage that may be caused by subsequent process steps.

Figure 1B:
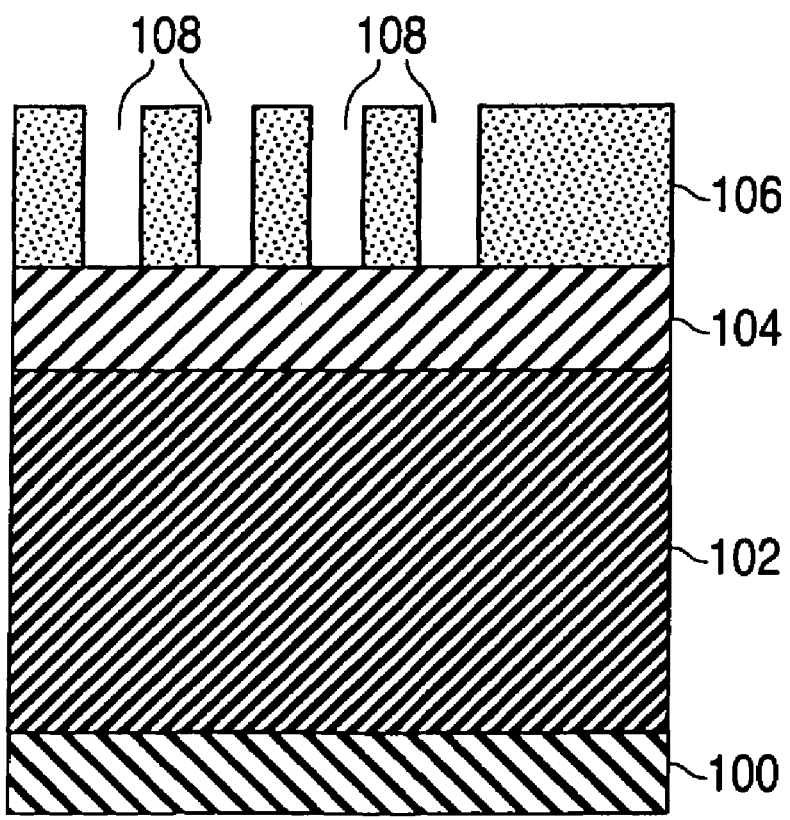

With reference to FIG. 1B, a photoresist layer 106 is formed over layer 104. Further, by well known lithographic techniques, layer 106 is exposed to a desired pattern, developed, and etched to form openings 108 corresponding to locations where trenches will subsequently be formed in dielectric layer 102.

Figure 1C:
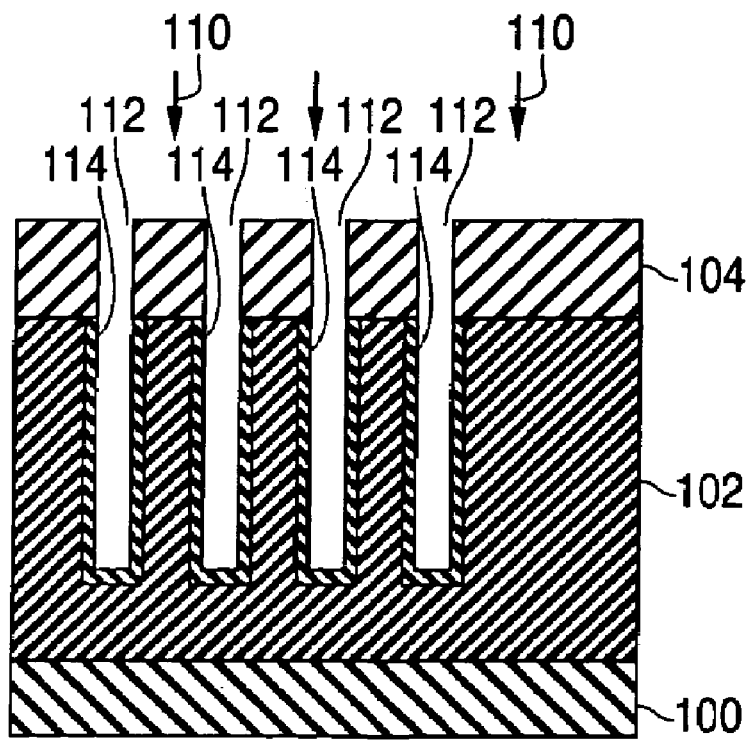

Next, as shown in FIG. 1C, an etching process 110 is performed through cap layer 104 to etch trenches 112 into dielectric layer 102. Etching process 110 may be performed by a dry etching process such as oxygen plasma etching. Subsequently, patterned photoresist layer 106 is removed.

Figure 1D:
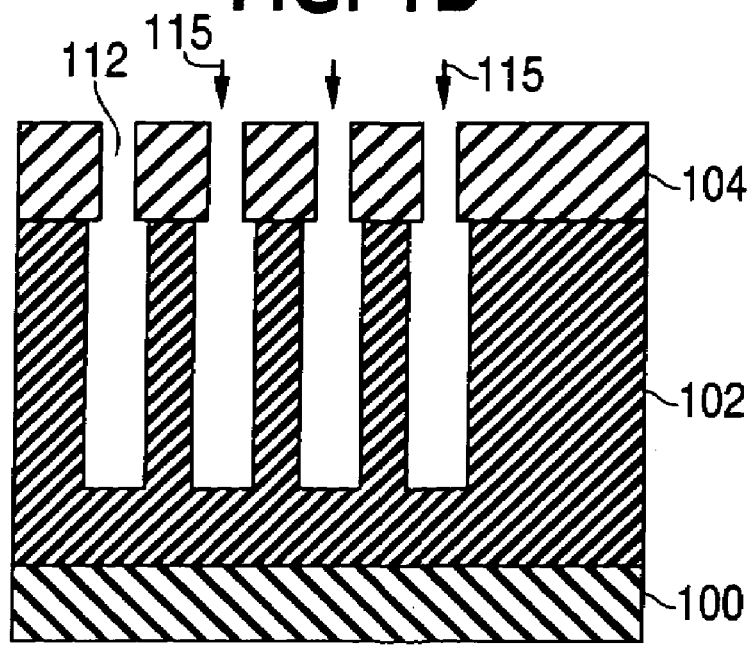

Etching process 110 may damage the exposed surface of dielectric layer 102 within trenches 112. Some techniques, such as dry etching in oxygen plasma, to remove photoresist layer 106, may also damage the exposed surface of dielectric layer 102 within trenches 112. Such damage undesirably increases the dielectric constant of dielectric layer 102. A damaged portion 114 of dielectric layer 102 is shown in FIG. 1C. In FIG. 1D, damaged portions 114 are removed by an etching process 115. A wet etching process, such as etching with a solution including hydrofluoric acid (HF), should be suitable for removal of damaged portions 114 of most low-k dielectric materials. It may also be possible to remove damaged portions 114 by plasma etching. The particular etching process used to remove damaged portions 114 is preferably selected on the basis of the particular low-k dielectric material provided for layer 102. For example, if layer 102 is formed of an oxide, then a fluorine-containing etching process can be utilized to remove damaged portions 114.

Figure 1E:
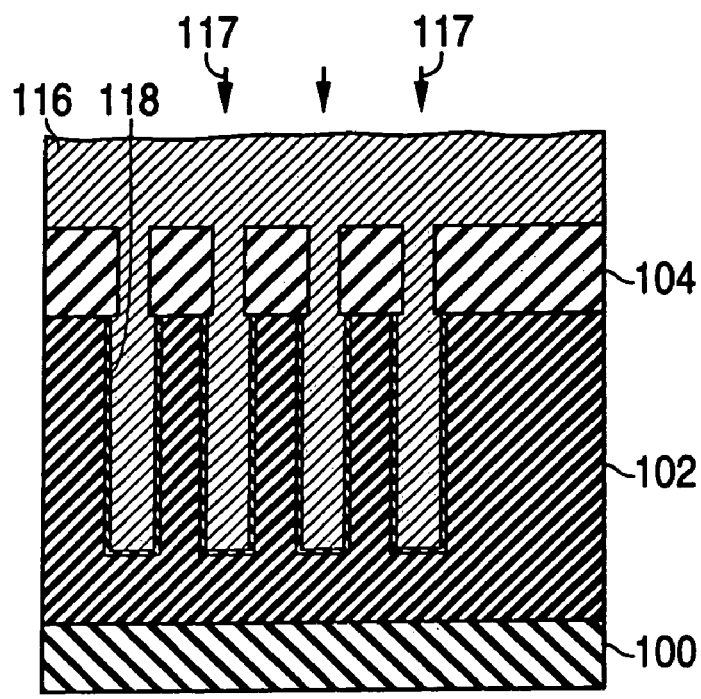

Next, with reference FIG. 1E, a conductive metal 116 is deposited by a process 117 to fill trenches 112 to form wirings and cover cap layer 104. In the illustrated example, metal 116 is copper deposited by electroplating. A barrier layer and a seed layer are deposited prior to such electroplating of copper. Examples of suitable barrier layer materials include titanium nitride and tungsten nitride, which may be deposited by CVD. The seed layer is preferably copper which may be deposited by CVD or physical vapor deposition (PVD). The barrier and seed layers are shown in FIG. 1E as a layer 118. It may also be possible to deposit conductive metal 116 as copper by a CVD process. While the use of copper is illustrated, other conductive metals that may be used as metal 116 include a copper alloy with a copper concentration of greater than about 10 percent, aluminum, an aluminum alloy with an aluminum concentration of greater than about 50 percent, gold, or silver. Aluminum and aluminum alloys may be deposited by sputtering, while gold or silver may be deposited by electroplating.

Figure 1F:
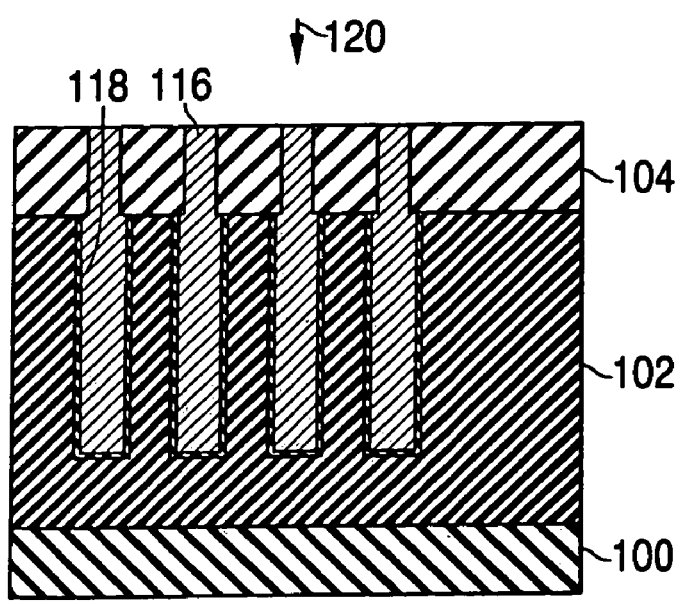

In FIG. 1F, the illustrated structure is subjected to chemical mechanical polishing (CMP) 120 to polish conductive metal 116 down to cap layer 104. Cap layer 104 serves as a polishing stop to protect against polishing 120 progressing into dielectric layer 102.

In the process illustrated in FIG. 1A-1F, trenches 112 were widened by the removal of damaged portions 114. In order to preserve critical dimension (CD) requirements of the IC being fabricated, it may be necessary to initially form trenches 112 to have a width of a first dimension that is narrower than that required by the CD, such that after removal of damaged portions 114, the final width of trench 112 is a second dimension that meets the CD requirement. As CDs become smaller, it may be necessary to utilize lithographic techniques that enable achieving sufficient resolution so that trenches 112 can initially be etched with a width smaller than that required by the CD. One example of a suitable technique utilizes a bi-layer resist process. The process utilizes a thin silicon containing top layer of resist provided over a thicker underlayer, which effectively planarizes the structure underneath. An implementation of the bi-layer process is disclosed in U.S. Pat. No. 6,551,938, the contents of which are incorporated in their entirety herein by reference.

Another conventional technique for patterning a photoresist as part of a damascene process while meeting very small CD requirements, is disclosed in U.S. Pat. No. 6,720,256, the contents of which are incorporated in their entirety herein by reference. The technique disclosed therein is also effective for forming a photoresist pattern having high resolution.

For ease of explanation, the process steps shown in FIGS. 1A-1F are limited to the formation of trenches and the deposition of conductive metal therein. However, as explained and illustrated below, embodiments consistent with the present invention can be implemented to form the full range of interconnect structures typically required in semiconductor IC fabrication.

Figure 2A:
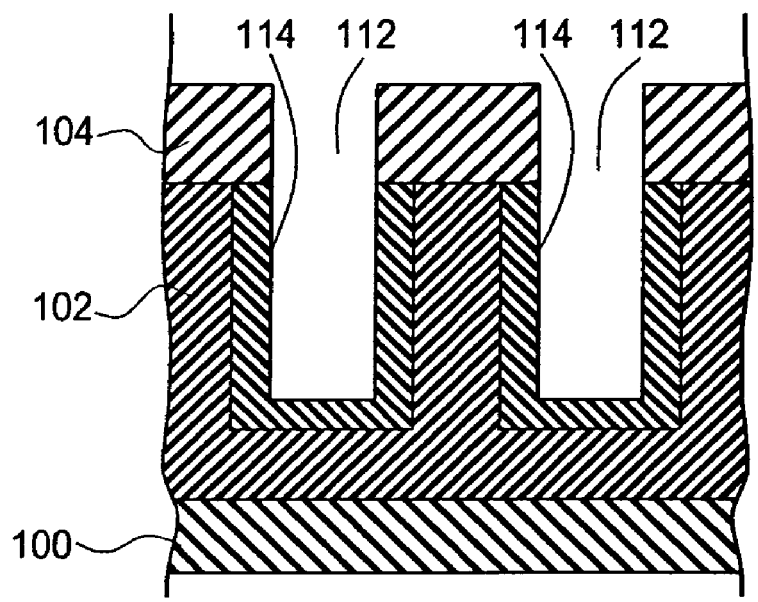
FIG. 2A-2D illustrate aspects of the process shown in FIGS. 1C-1F.
Figure 2B:
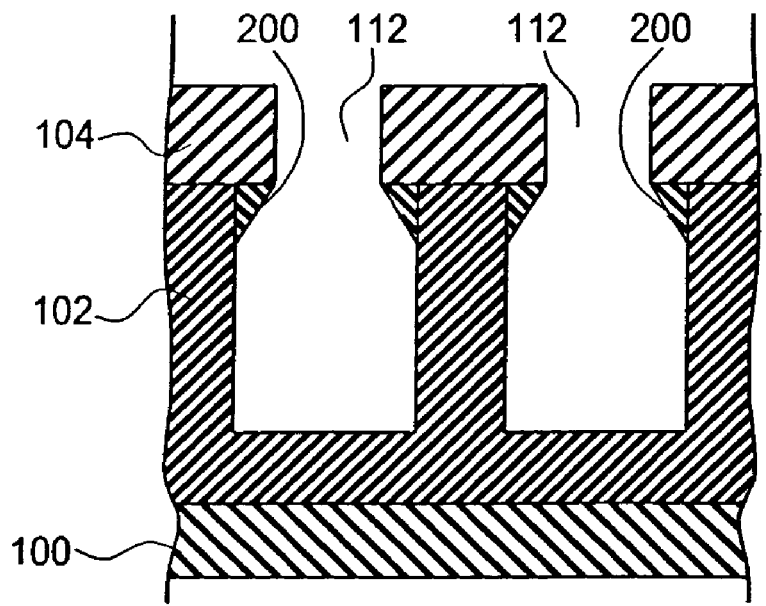

FIGS. 2A-2D illustrate aspects of the process shown in FIGS. 1C-1F in greater detail. FIG. 2A illustrates two of trenches 112 formed by etching and corresponds to the state of the process as shown in FIG. 1C. FIG. 2B shows in greater detail the result of removing damaged portions 114 from trenches 112. The etching to remove damaged portions 114 may be isotropic with the result of leaving small remnants 200 of damaged portions 114 in top edges of each trench 112. The inventors have observed that such remnants of damaged portions 114 may remain at the interface of different materials, such as at the interface between layers 102 and 104. The size of remnants 200 relative to the overall depth and width of trench 116 is intentionally exaggerated for illustrative purposes to show the general configuration of remnants 200. The actual size of remnants 200, as well as whether remnants 200 remain after etching to remove damaged portions 114, is a function of design choice, the dielectric material selected for layer 102, the nature of etching 110 to form trenches 112 and etching process 115 used to remove damaged portions 114.

The selection of dielectric material and an etching process in order to intentionally leave remnants 200 of damaged portions 114 is optional. However, in accordance with a further embodiment of the present invention, intentional selection of the dielectric material and etching process to leave remnants 200, can afford beneficial effects in the operation of the finally constructed interconnect structure, as more fully described below.

Figure 2C:
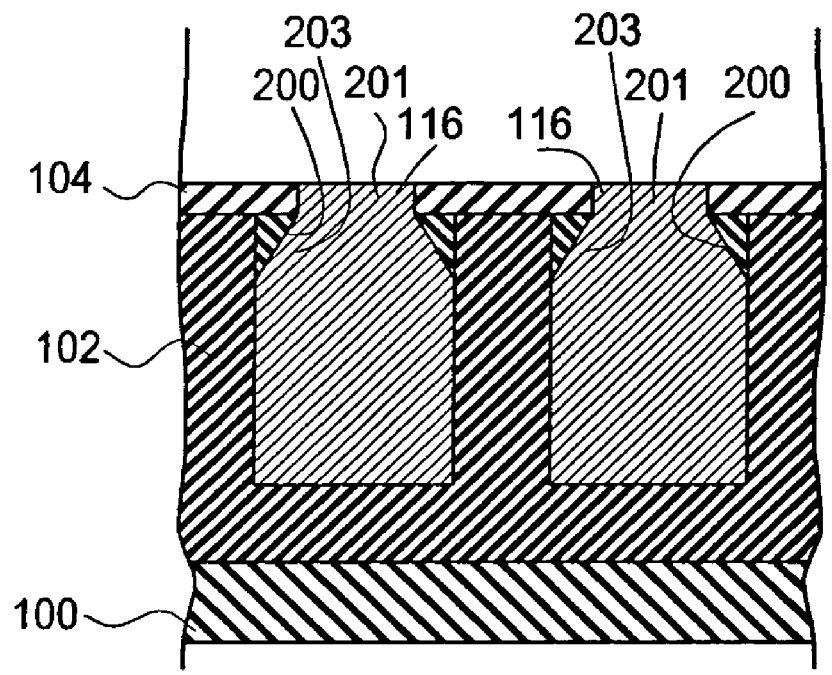

FIG. 2C illustrates trenches 112 after being filled with conductive metal 116 to form wirings and subjected to CMP 120, and thus corresponds to the state of the process as shown in FIG. 1F. For convenience of illustration, layer 118 is not shown. In FIG. 2C, CMP 120 has been performed to polish down partially into cap layer 104. As a result, a portion of cap layer 104 remains and defines the shape of conductive metal 116 as having a neck portion 201 at the top of trench 112. The remaining portion of cap layer 104 that defines the neck portion 201 of conductive metal 116 provides wider spacing between conductive metal 116 in adjacent trenches 112 than may otherwise be achieved. The presence of remnant 200 at the top edge portions of each trench results in conductive metal 116 having portions 203 at the top edge portions thereof, which are blunted or curved. Blunted or curved as used herein is intended to cover a shape of each top edge portion of conductive metal 116 resulting from conformance to remnant 200. Thus, remnant 200 may have a curved surface or a flat surface, the latter being illustrated in FIG. 2C, with the result that the top edge portion of conductive material 116 does not form a single discrete angle, e.g., approximately 90°, at the top edge, but instead may either be curved or include a flat section that forms angles greater than 90° with the side and top surfaces of metal 116, as shown in FIG. 2C, or some combination of flat and curved sections.

Portions 203 reduce electric field concentration at the edge portions, which mitigates a potential problem with time dependent dielectric breakdown. Further, the increased spacing between adjacent trenches due to the remaining portion of cap layer 104, that defines neck 201, also improves the dielectric strength between those adjacent portions.

Figure 2D:
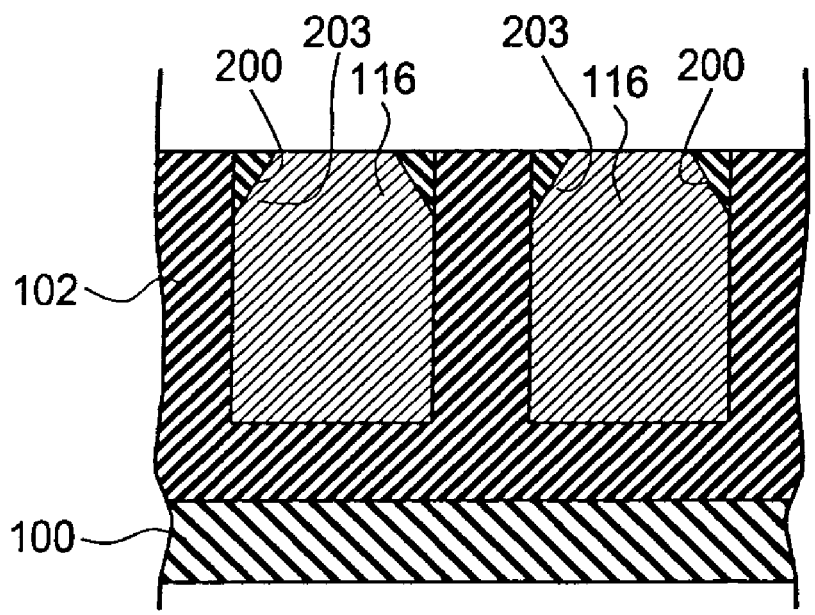

FIG. 2D illustrates an alternative structure to the one shown in FIG. 2C. More particularly, FIG. 2D illustrates trenches 112 after being filled with conductive metal to form wirings and subjected to CMP 120. However, in the structure shown in FIG. 2D, CMP 120 has been performed to substantially completely remove cap layer 104 such that CMP 120 is stopped upon reaching dielectric layer 102. As a result, conductive metal 116 deposited in each trench 112 does not include the neck portion 201 defined by the remaining portion of cap layer 104 in the structure shown in FIG. 2C. Nevertheless, portions 203 at the top of conductive metal 116 within each trench 112 reduce electric field concentrations and thereby mitigates potential problems of time dependent dielectric breakdown. Also, the tapering at the top portion of conductive metal 116 due to remnants 200, results in wider spacing between conductive metal 116 in adjacent trenches than may otherwise be achieved.

Additionally, the inventors have determined that the presence of remnants 200 does not have any appreciable effect on the dielectric constant of the dielectric layer 102.

Figure 3A:
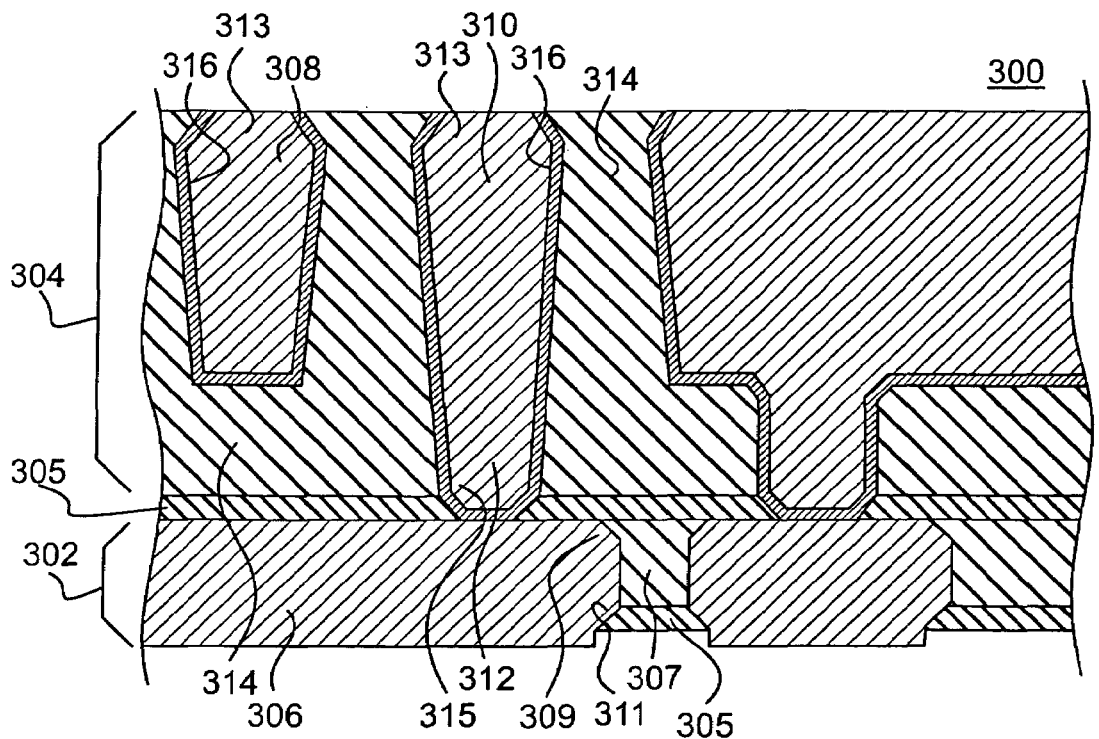
FIG. 3A-3B illustrate examples of multiple layers of metal interconnect structures formed by processes consistent with the present invention.
Figure 3B:
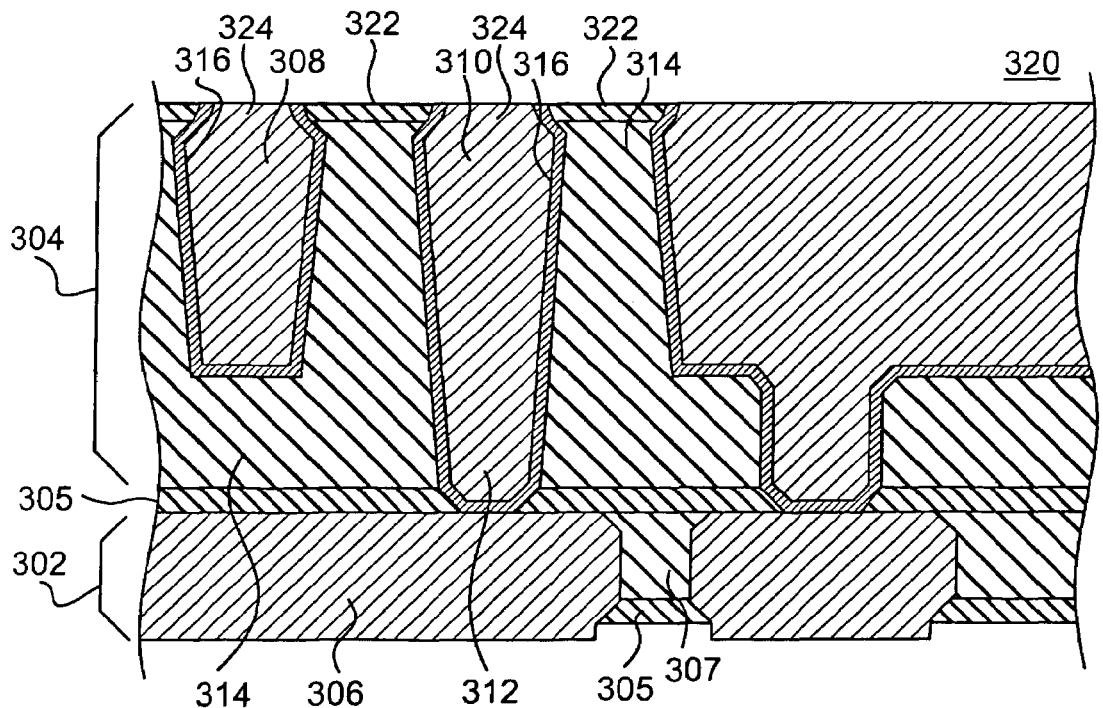

FIGS. 3A and 3B illustrate examples of multiple layers of metal interconnect structures formed by processes consistent with the present invention. More particularly, FIG. 3A shows a portion 300 of a semiconductor IC including a first metal interconnect layer 302 and a second metal interconnect layer 304. First interconnect layer 302 is an example of a layer formed by a single-damascene process, while second interconnect layer 304 is an example of a layer formed by a dual-damascene process. ESLs 305 may be provided beneath layer 302 and between layers 302 and 304 to facilitate the formation of metal interconnects in layers 302 and 304. First interconnect layer 302 includes a trench 306 extending across FIG. 3A, filled with conductive metal to form a wiring, and formed in a low-k dielectric layer 307. Trench 306 is formed using processes consistent with embodiments described above to result in a blunted or curved edge portion 309 at the top of the conductive metal deposited in trench 306. A blunted or curved edge portion 311 formed at the bottom of the conductive metal deposited in trench 306 is mainly due to ESL 305 having a slower etch rate than layer 307 during the etching process that forms trench 306.

Second interconnect layer 304 includes trenches 308 and 310, which extend perpendicular to FIG. 3A, and a via 312, formed in a low-k dielectric layer 314, trenches 308 and 310 filled with conductive metal to form wirings, and via 312 filled with conductive metal to form a conductive plug. Trenches 308 and 310 and via 312 are formed using processes consistent with embodiments described above to result in blunted or curved edge portions 313 at the top of the conductive metal deposited in each of trenches 308 and 310. Blunted or curved edge portions 315 at the bottom of via 312 are mainly due to ESL 305 having a slower etch rate than dielectric layer 314 during the etching process that forms via 312. As previously described, dielectric materials and etching processes can be selected such that blunted or curved edge portions are not formed at the top or bottom of a trench. Optionally, as shown in FIG. 3A, trenches 308 and 310 can have sidewalls which taper inward toward the bottom, such tapered sidewalls resulting from use of a dry etching process, e.g., a plasma etching process.

FIG. 3A also shows provision of a layer 316 that represents both a barrier layer and a seed layer deposited to line trenches 308 and 310 and via 312 before depositing a conductive metal therein, such as copper, that requires use of barrier and seed layers therewith.

FIG. 3B shows a portion 320 of a semiconductor IC including metal interconnect layers 302 and 304. However, portion 320 differs from portion 300 in that a portion of a cap layer 322 was retained when CMP 120 was performed. As a result, the portion of cap layer 322 remains and defines the shape of the conductive metal in each of trenches 308 and 310 as having a neck portion 324 at the top thereof.

Figure 4A:
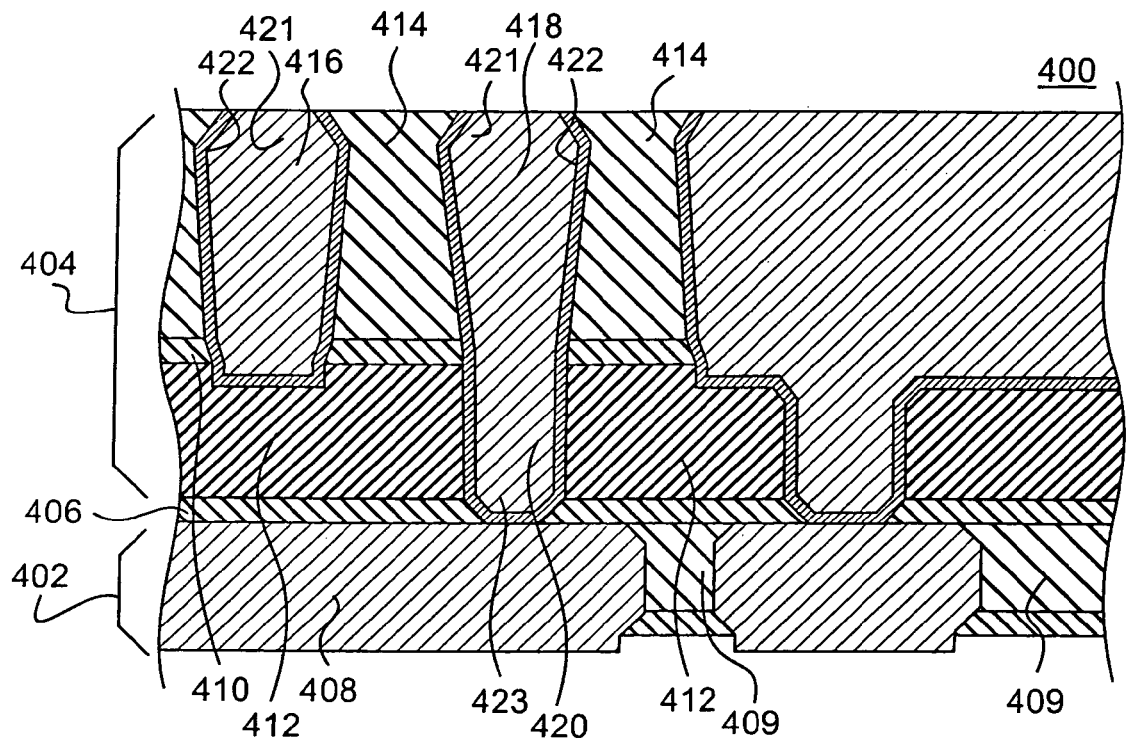
FIGS. 4A and 4B illustrate further examples of multiple layers of metal interconnect structures formed by processes consistent with the present invention.
Figure 4B:
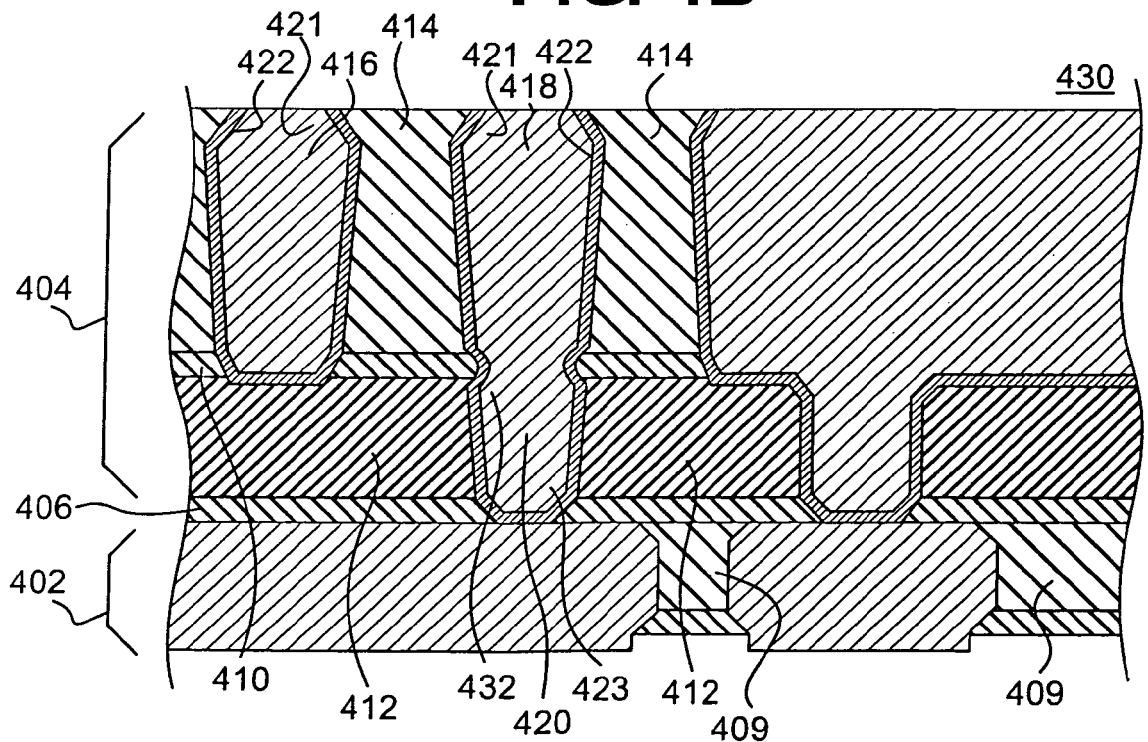

FIGS. 4A and 4B illustrate further examples of multiple layers of metal interconnect structures formed by processes consistent with the present invention. More particularly, FIG. 4A illustrates a portion 400 of a semiconductor IC including a first metal interconnect layer 402 and a second metal interconnect layer 404. First interconnect layer 402 is an example of a layer formed by a single-damascene process while second interconnect layer 404 is an example of a layer formed by a dual-damascene process. An ESL 406 may be provided between layers 402 and 404 to facilitate the formation of metal interconnects in layer 404. First interconnect layer 402 includes a trench 408 extending across FIG. 4A, filled with a conductive material to form a wiring and formed in a low-k dielectric layer 409. Trench 408 has the same features as may be formed by the same process for forming trench 306 in FIG. 3A. Second interconnect layer 404 is formed by a dual-damascene process utilizing an ESL 410 which separates the dielectric material of second layer 404 into a lower layer 412 and an upper layer 414. Layers 412 and 414 can both be formed of low-k dielectric material, but need not be formed of the same dielectric material. For example, layer 412 may be a dielectric formed by CVD, while layer 414 may be a dielectric formed by a spin-on process. Upper layer 414 has formed therein trenches 416 and 418 filled with conductive material to form wirings. A via 420 is formed through lower layer 412 and is also filled with conductive metal to form a conductive plug. Layer 422 representing barrier and seed layers may be provided if needed for the particular conductive metal deposited in trenches 416 and 418 and via 420.

Trenches 416 and 418 and via 420 are formed using processes consistent with embodiments described above to result in blunted or curved edge portions 421 at the top of the conductive metal deposited into each of trenches 416 and 418. Blunted or curved portions 423 at the bottom of via 420 are mainly due to ESL 406 having a slower etch rate than lower layer 412 during the etching process that forms via 420. The tapered portion near the bottom of trench 416 is mainly due to ESL 410 having a slower etch rate that upper layer 414 during the etching process that forms trench 416. Additionally, since upper layer 414 suffers less damage at the bottom of trench 416 than at upper portions thereof, there is less damaged dielectric material to remove from the bottom of trench 416. In accordance with processes known in the art, layer 404 is formed by a dual-damascene process that includes deposition of ESL 410. ESL 410 serves to limit the depth of etching when etching is performed to form trench 416.

FIG. 4B shows a portion 430 of a semiconductor IC including metal interconnect layers 402 and 404. However, portion 430 differs from portion 400 in that via 420 is formed by processes consistent with embodiments described above to result in rounded edged portions 432 at the top of the conductive metal deposited in via 420. Further, the provision of blunted or curved edge portions 432 in FIG. 4B or their absence in FIG. 4A is also determined by the extent to which etching is performed to form trench 418 which connects to via 420.

Figure 5A:
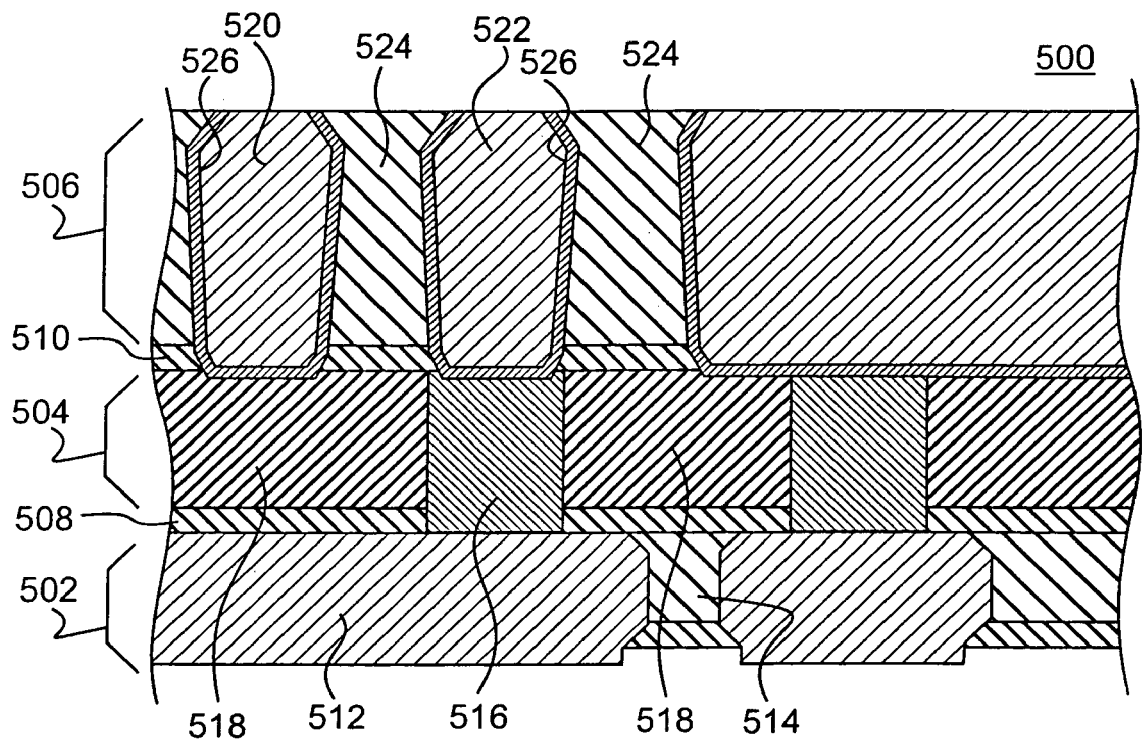
FIGS. 5A and 5B illustrate still further examples of multiple layers of metal interconnect structures formed by processes consistent with the present invention.
Figure 5B:
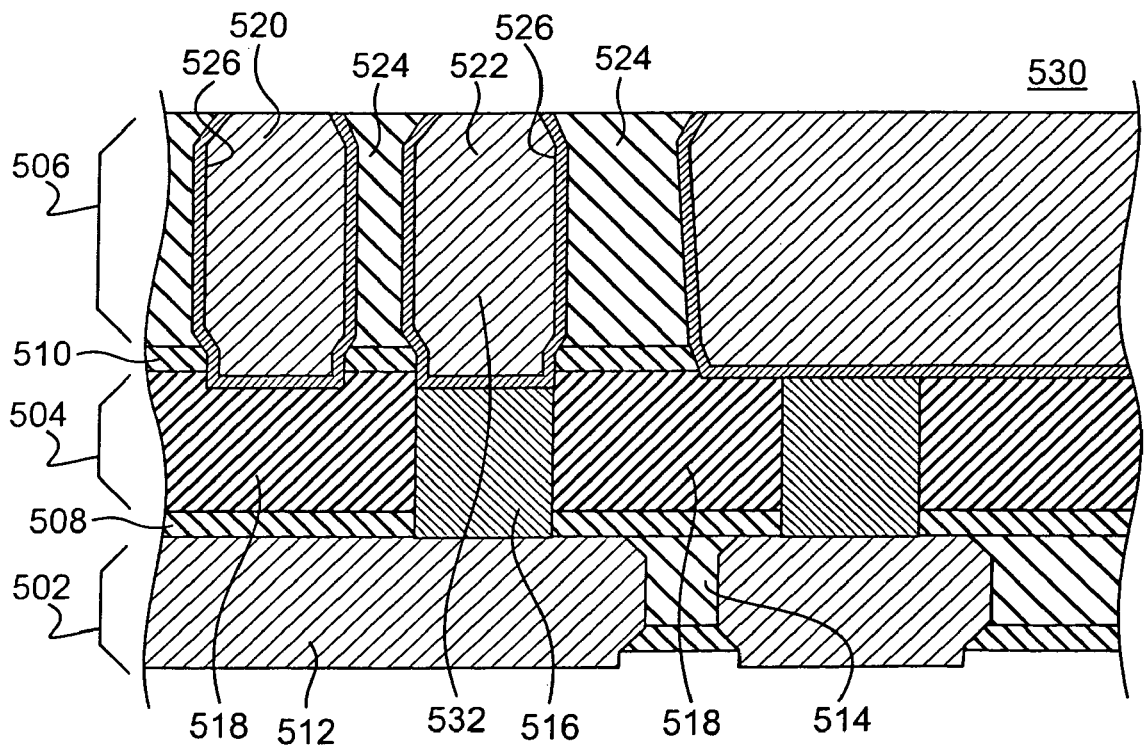

FIGS. 5A and 5B illustrate further examples of multiple layers of metal interconnect structures formed by processes consistent with the present invention. More particularly, FIG. 5A illustrates a portion 500 of a semiconductor IC including a first metal interconnect layer 502, a second metal interconnect layer 504, and a third metal interconnect layer 506. Each of first interconnect layer 502, second interconnect layer 504, and third interconnect layer 506 is formed by a single-damascene process. An ESL 508 is formed between layers 502 and 504 and an ESL 510 is formed between layers 504 and 506. First interconnect layer 502 includes a trench 512, formed in a low-k dielectric layer 514, extending across FIG. 5A and filled with conductive metal to form a wiring. Trench 512 has the same features as may be formed by the processes for forming trench 306 in FIG. 3A.

Layer 504 includes a via 516, formed in a low-k dielectric layer 518, and filled with conductive metal to form a conductive plug which connects to the wiring in trench 512. Via 516 is formed without any blunted or curved edge as a result of performing CMP on the top of via 516 to remove any blunted or curved portions at the top edges thereof.

Layer 506 includes trenches 520 and 522 which are formed in a dielectric layer 524 using processes consistent with embodiments described above to result in blunted or curved edge portions at the top of the conductive metal deposited in each of trenches 520 and 522. The tapered portion at the bottom of each of trenches 520 and 522 is mainly due to ESL 510 having a slower etch rate than dielectric layer 524 during the etching process that forms trenches 520 and 522. Additionally, since dielectric layer 524 suffers less damage at the bottom of trenches 520 and 522 than at upper portions of trenches 520 and 522, there is less damaged dielectric material to remove from the bottom of trenches 520 and 522. Trenches 520 and 522 are formed by a single damascene process and are lined with a layer 526 representing barrier and seed layers, which may be provided if needed for the particular conductive metal being deposited.

Trenches 520 and 522 have tapered sides that narrow the width of each trench toward the bottom thereof. As explained above, such tapering is achieved by use of a dry etching process.

FIG. 5B shows a portion 530 of a semiconductor IC including metal interconnect layers 502, 504 and 506. However, portion 530 differs from portion 500 in that trenches 520 and 522 are formed to each have a neck portion 532 at the bottom. Also, trenches 520 and 522 of portion 530 have vertical sides in contrast to the tapered sides show in portion 500 in FIG. 5A. Such vertical sides are formed using a dry etching process when removing the damaged portions of dielectric layer 524.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for making a semiconductor integrated circuit, comprising:
   forming a low-k dielectric layer over the semiconductor substrate;
   forming a dielectric cap layer over a low-k dielectric layer;
   performing a first etching by plasma etching the dielectric cap layer and the low-k dielectric layer to form a first opening in the dielectric cap layer and a second opening in the low-k dielectric layer, the first and second openings each having a width substantially equal to a first dimension; and performing a second etching, by one of a plasma and a non-plasma etching technique, of sidewalls of the second opening so that a width of the second opening is a second dimension greater than the first dimension, wherein performing the second etching includes performing the second etching to leave a remnant portion in a top edge portion of the sidewalls of the second opening.

2. The method of claim 1 further including:

forming and patterning, prior to performing the first etching, a photoresist layer over the dielectric cap layer, the photoresist layer including a third opening have a width substantially equal to the first dimension;

wherein performing the first etching includes etching through the third opening to form the first and second openings.

3. The method of claim 1 wherein forming the dielectric cap layer includes forming the dielectric cap layer to have a dielectric constant of greater than about 2.8.

4. The method of claim 1, wherein forming the low-k dielectric layer includes forming the low-k dielectric layer to have a thickness of less than about 7000 Å.

5. The method of claim 1, wherein forming the dielectric cap layer includes forming the dielectric cap layer to comprise one of a composite layer, a carbon-containing film, silicon nitride, silicon oxynitride, and a hard mask.

6. The method of any one of claims 2-5, wherein forming the dielectric cap layer includes forming the dielectric cap layer to have a thickness of less than about 600 Å.

7. The method of claim 1, wherein forming the low-k dielectric layer includes forming the low-k dielectric layer by a chemical vapor deposition process.

8. The method of claim 1, wherein forming the low-k dielectric layer includes forming the low-k dielectric layer by a spin-on process.

9. The method of claim 1, wherein forming the low-k dielectric layer includes forming the low-k dielectric layer to have a dielectric constant of less than about 2.5.

10. The method of claim 1, wherein forming the low-k dielectric layer includes forming the low-k dielectric layer to comprise one of a carbon-containing film, fluorinated silicate glass, SiLK™, a porous film, an organic low-k dielectric material, and an inorganic low-k dielectric material.

11. The method of any one of claims 7-10, wherein forming the low-k dielectric layer includes forming the low-k dielectric layer to have a thickness of less than about 7000 Å.

12. The method of claim 1, wherein performing the second etching includes etching the sidewalls of the second opening by a wet etching process.

13. The method of claim 1, wherein performing the second etching includes etching the sidewalls of the second opening by a dry etching process.

14. The method of claim 1, wherein performing the second etching includes etching the sidewalls of the second opening with a solution comprising hydrogen fluoride (HF).

15. The method of claim 1, further including:
forming a barrier layer in the second opening;
forming conductive metal over the barrier layer to fill the second opening and the first opening; and
polishing the conductive metal down to at least the cap layer to form a flat surface of the conductive metal.

* * * * *